(12) United States Patent
Kalati (10) Patent No.: US 9,965,998 B2
(45) Date of Patent: May 8, 2018

(54) METHOD FOR PRINTING AN ELECTRONIC LABEL (71) Applicant: Eastman Kodak Company, Rochester, NY (US)

(72) Inventor: Dan Kalati, Herzeliya (IL)

(73) Assignee: EASTMAN KODAK COMPANY, Rochester, NY (US)

( * ) Notice: Subject to any disclaimer, the term of this patent is extended or adjusted under 35 U.S.C. 154(b) by 252 days.

(21) Appl. No.: 14/856,620

(22) Filed: Sep. 17, 2015

(65) Prior Publication Data

US 2017/0086302 A1  Mar. 23, 2017

(51) Int. Cl.
*H05K 3/02* (2006.01)
*G09G 3/30* (2006.01)
*H05B 33/12* (2006.01)
*C09K 11/56* (2006.01)
*H01B 1/12* (2006.01)
*H05K 3/12* (2006.01)

(52) U.S. Cl.
CPC .............. *G09G 3/30* (2013.01); *C09K 11/565* (2013.01); *H01B 1/127* (2013.01); *H01B 1/128* (2013.01); *H05B 33/12* (2013.01); *H05K 3/027* (2013.01); *G09G 2380/04* (2013.01); *H05K 3/1275* (2013.01); *H05K 2201/0108* (2013.01); *H05K 2203/107* (2013.01)

(58) Field of Classification Search
CPC ............ H01L 51/0022; H01L 51/0096; H05K 1/0306; H05K 3/10; H05K 3/027; H05K 3/1275; H05K 2201/0108; H05K 2203/107; C09K 11/565; G09G 3/30; G09G 2380/04; H01B 1/127; H01B 1/128; H05B 33/12
See application file for complete search history.

(56) References Cited

U.S. PATENT DOCUMENTS

| | | | |
|---|---|---|---|
| 7,052,924 B2 * | 5/2006 | Daniels | H01L 27/14625 257/E25.02 |
| 8,318,358 B2 | 11/2012 | Nelson et al. | |
| 8,974,918 B2 * | 3/2015 | Yamazaki | G02F 1/13439 428/336 |
| 9,085,699 B2 | 7/2015 | Wang et al. | |
| 2005/0106566 A1 * | 5/2005 | Breniaux | C09D 4/00 435/6.12 |
| 2015/0101745 A1 | 4/2015 | Ramakrishnan et al. | |
| 2015/0129847 A1 * | 5/2015 | Takada | H01L 51/5206 257/40 |

* cited by examiner

*Primary Examiner* — Carl Arbes
(74) *Attorney, Agent, or Firm* — Kevin E. Spaulding (57) ABSTRACT

A method for forming an electronic label including using laser imaging to form a pattern of conductive lines on a conductive film, thereby forming a patterned conductive layer. A phosphorescent layer and a dielectric layer are added over the patterned conductive layer. A conductive trace layer is printed over the dielectric layer using a conductive ink including a pattern of conductive traces that overlap with the conductive lines of the patterned conductive layer to form an electric grid in a display area. One or more electronic components and a power source are added that are adapted to supply power and control signals to the electric grid.

14 Claims, 10 Drawing Sheets

METHOD FOR PRINTING AN ELECTRONIC LABEL

FIELD OF THE INVENTION

The present invention relates to methods and apparatus for printing an electronic label on a package.

BACKGROUND OF THE INVENTION

Package labels are usually printed separately and are added to a package later. Labels may printed on an adhesive substrate, for example, and adhered to a package after the package is printed. Labels may be printed by traditional or digital printing methods. Digital printing may provide variable label printing options. In certain cases, labels are printed directly on the package as well.

U.S. Patent Publication No. 2015/0101745 (Ramakrishnan et al.), entitled "Manufacturing of high resolution conductive patterns using organometallic ink and banded anilox rolls," teaches printing an electronic grid for touch sensors. The process is achieved by flexographic printing, wherein two pre-patterned layers are prepared, each on a separate flexographic master and printed using those flexographic masters to form touch sensors. The process provides a very fine conductive pattern on a thin and flexible display. The process uses laser ablation on at least one axis of the grid lines by ablating a highly conductive film (HCF). Flexible displays are often based on organic light-emitting diode (OLED) which are still not in mass production and has numerous reliability, lifetime and yield issues. The electroluminescent flexible displays or touch sensors which are produced by printing methods, as the one described by Ramakrishnan et al., cannot provide as high resolution patterning results as laser ablation can achieve.

The usual packaging labels are printed using printing ink on various substrates such as paper and plastic. There remains a need for improved methods to print labels on packages with variable content.

SUMMARY OF THE INVENTION

The present invention represents a method for forming an electronic label which includes:

providing a conductive film including a conductive layer on a substrate;

using laser imaging to form a pattern of conductive lines on the conductive film, thereby forming a patterned conductive layer;

adding a phosphorescent layer over the patterned conductive layer;

adding a dielectric layer over of the phosphorescent layer;

printing a conductive trace layer over the dielectric layer using a conductive ink, wherein the conductive trace layer includes a pattern of conductive traces that overlap with the conductive lines of the patterned conductive layer to form an electric grid in a display area;

adding one or more electronic components adapted to supply control signals to the electric grid; and adding a power source adapted to supply power to the electronic components and the electric grid.

This invention has the advantage that electronic labels can be made having the ability to provide variable content using inexpensive fabrication processes.

It has the additional advantage that electronic labels fabricated using this process can be large, flexible and lightweight, and can support high resolution and small feature sizes.

It has the further advantage that conductive lines formed using laser imaging can be made with a higher level of accuracy and resolution than those formed using conventional methods.

BRIEF DESCRIPTION OF THE DRAWINGS

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure. It is to be understood that elements not specifically shown or described may take various forms well known to those skilled in the art.

While the present invention is described in connection with an exemplary embodiment, it will be understood that it is not intended to limit the invention to this embodiment. On the contrary, it is intended to cover alternatives, modifications, and equivalents as covered by the appended claims. The use of singular or plural in referring to elements of the invention is not limiting. It should be noted that, unless otherwise explicitly noted or required by context, the word "or" is used in this disclosure in a non-exclusive sense.

Figure 1:
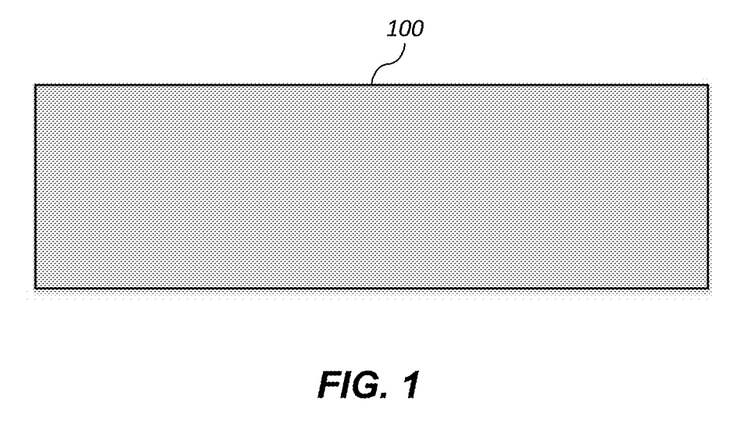
FIG. 1 illustrates a highly conductive film (HCF) substrate.

A method and apparatus will be described herein for producing an electronic label, made by laser and printing means. A conductive film 100 is used as a substrate for the electronic label, and is used for forming one set of conductive lines is, as shown in FIG. 1. In an exemplary embodiment, the conductive film 100 is a Highly Conductive Film (HCF) including a solid PEDOT (Poly 3,4-ethylenedioxythiphene) conductive layer coated on PET (Polyethylene Terephthalate) substrate. As will be described later, electronic lines will be formed on the conductive film 100, for example using laser ablation methods. Preferably, the conductive film 100 is transparent. The transparency of the substrate enables showing other layers that will be added to it.

Figure 2:
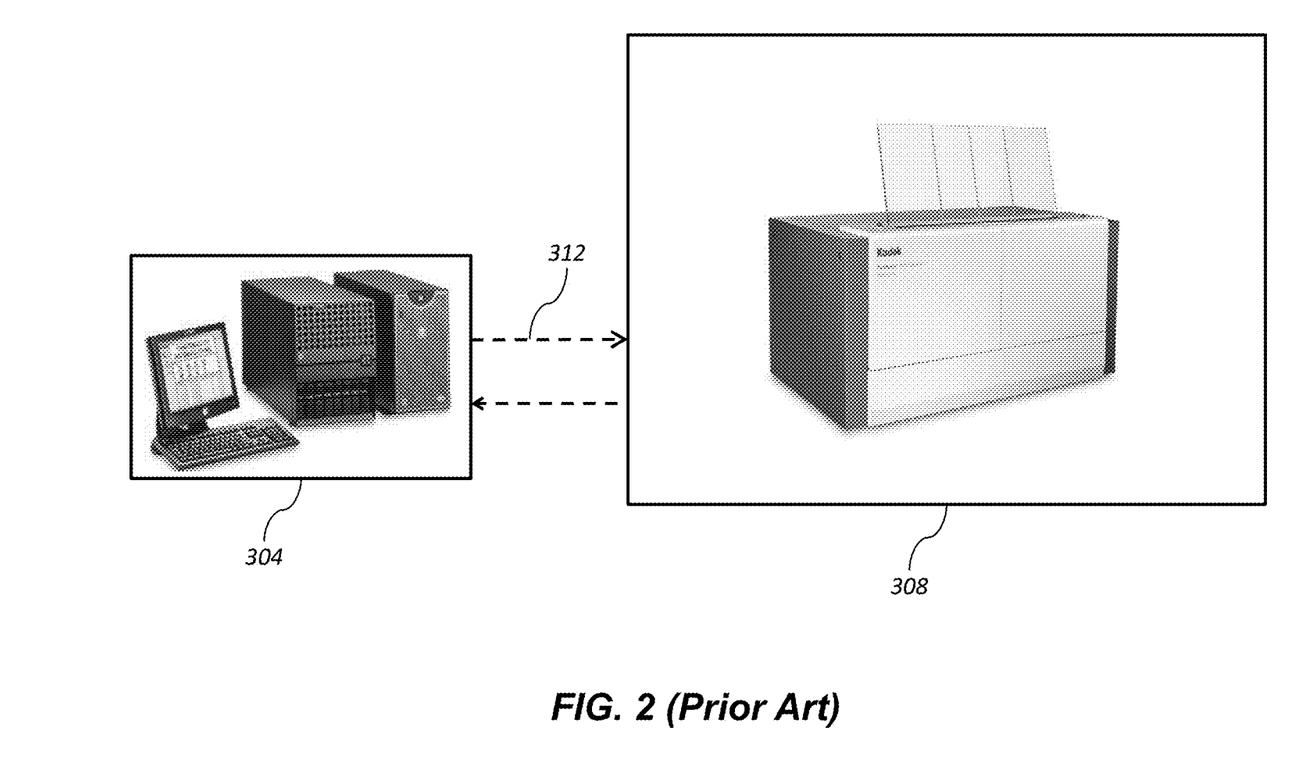
FIG. 2 represents in diagrammatic form a digital front end driving an imaging device.

FIG. 2 shows an imaging device 308. The imaging device 308 is driven by a digital front end (DFE) 304. The DFE 304 receives printing jobs in a digital form from desktop publishing (DTP) systems (not shown). The printing jobs include the position and content of both the graphical information as well as the information required to print the electronic label. The DFE renders the digital information for imaging. The rendered information and imaging device control data are communicated between DFE 304 and imaging device 308 over interface line 312.

Figure 3:
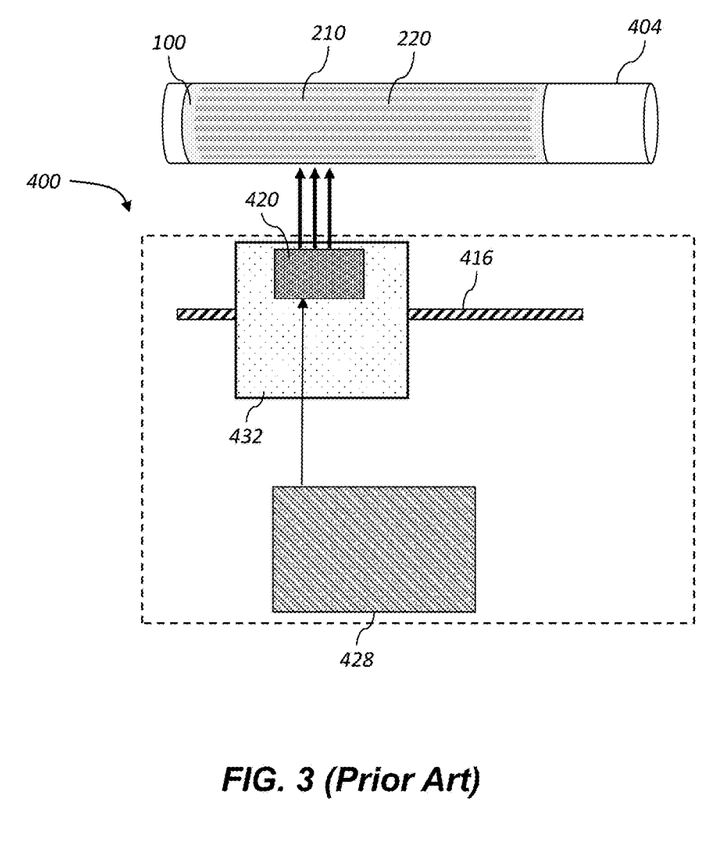
FIG. 3 represents in diagrammatic form an imaging system including a laser imaging head for performing laser ablation.
Figure 4:
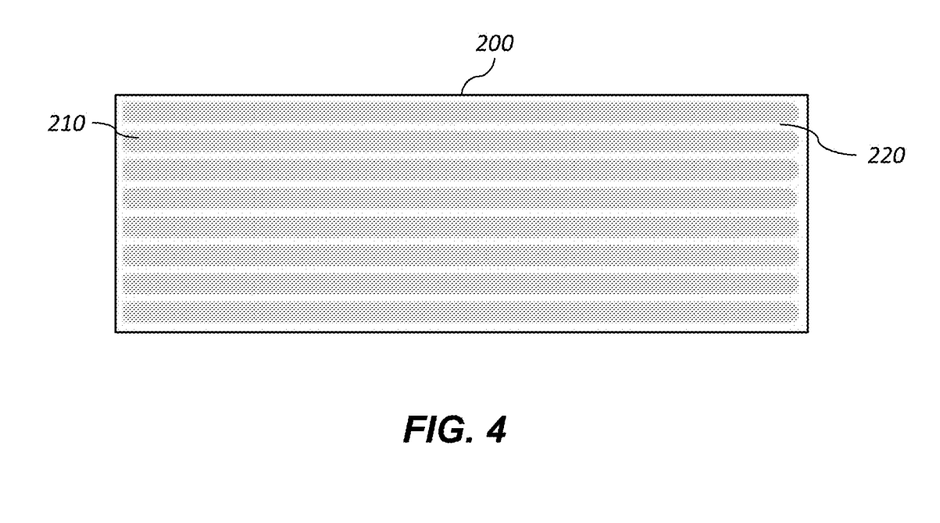
FIG. 4 illustrates conductive lines formed on HCF.

FIG. 3 shows an imaging system 400. The imaging system 400 includes an imaging carriage 432 on which an imaging head 420 is mounted. The imaging head 420 is controlled by a controller 428, and is configured to image on the conductive film 100, which is mounted on a rotating cylinder 404. The imaging carriage 432 is adapted to move substantially in parallel to the surface of rotating cylinder 404 and is guided by an advancement screw 416. The conductive film 100 is imaged by the laser imaging head 420 to form patterns of fine conductive lines 210, removing conductive material by laser ablation producing reduced conductivity areas 220. The result is a patterned conductive layer 200 having a pattern of fine conductive lines 210 and reduced conductivity areas 220, as is shown in FIG. 4. In an alternate embodiment (not shown here), instead of forming conductive lines 210 by laser ablation of a conductive film 100, a PET substrate can be used wherein conductive lines 210 can be formed on it by a printing process. Using laser ablation in combination with a conductive film 100 will typically lead to more accurate conductive lines, and can produce higher yields, thereby lowering the cost relative to using a conventional printing process.

Figure 5:
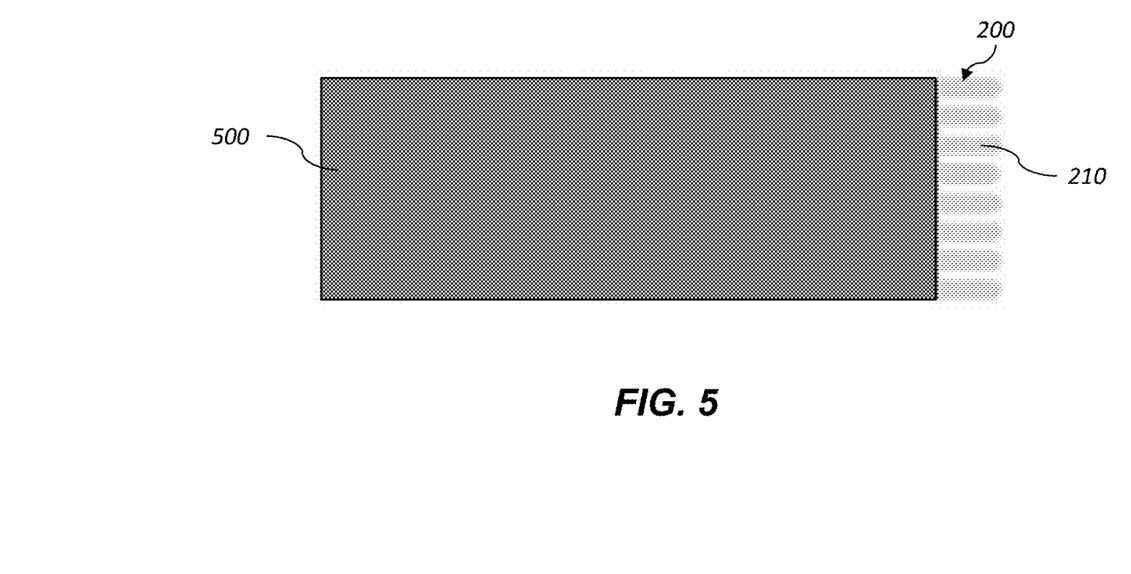
FIG. 5 illustrates a phosphorescent layer formed over a patterned conductive layer.

FIG. 5 shows a phosphorescent layer 500, formed over the patterned conductive layer 200. The phosphorescent layer 500 can be made using any appropriate phosphor material known in the art. In an exemplary embodiment, the phosphorescent layer 500 can be formed with a phosphor material based on zinc sulfide (ZnS). Examples of such phosphor materials include: ZnS:Cu, for blue-green light, ZnS:Cl for blue light and ZnS:Mn for orange-yellow light. Other combinations can be done based on ZnS for achieving different colors having a variety of durability-related characteristics. The phosphor in the phosphorescent layer 500 will glow selectively when a voltage is applied across the phosphorescent layer 500. The phosphorescent layer 500 is applied over the patterned conductive layer 200. In a preferred embodiment, the phosphorescent layer 500 is applied using a printing process where the phosphor material is incorporated in an ink. Any appropriate printing process known in the art can be used to apply the phosphorescent layer 500. For example, a flexographic printing process or a rotary screen printing process can be used. In other embodiments, the phosphorescent layer 500 can be applied using a coating process.

Figure 6:
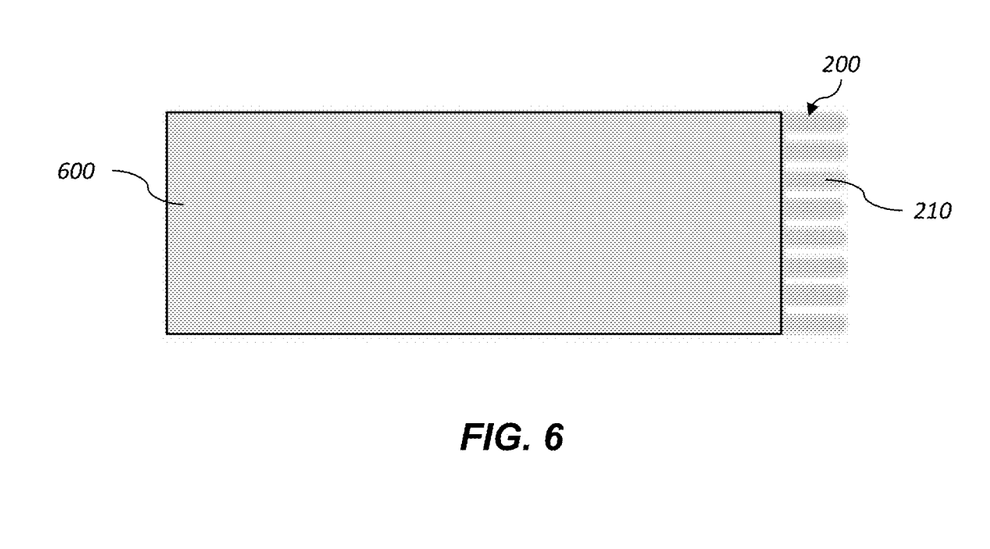
FIG. 6 illustrates a dielectric layer formed over the phosphorescent layer.

FIG. 6 illustrates a dielectric layer 600 formed on top of the phosphorescent layer 500. The dielectric layer 600 is made using a dielectric material and provides a separation between the conductive layer 200, and other conductive layers that will be applied in additional layers. Examples of dielectric materials that can be used in accordance with the present invention include titanate (BaTiO3) powder plus binder, Gwent dielectric D2070209P6 and Dupont dielectric 8153. In a preferred embodiment, the dielectric layer 600 is applied using a printing process where the dielectric material is incorporated in an ink. Any appropriate printing process known in the art can be used to apply the dielectric layer 600. For example, a flexographic printing process or a rotary screen printing process can be used. In other embodiments, the dielectric layer 600 can be applied using a coating process. Part of the patterned conductive layer 200 is exposed and not covered by the dielectric layer 600. This provides contact points where electrical signals can be applied to the conductive lines 210.

Figure 7:
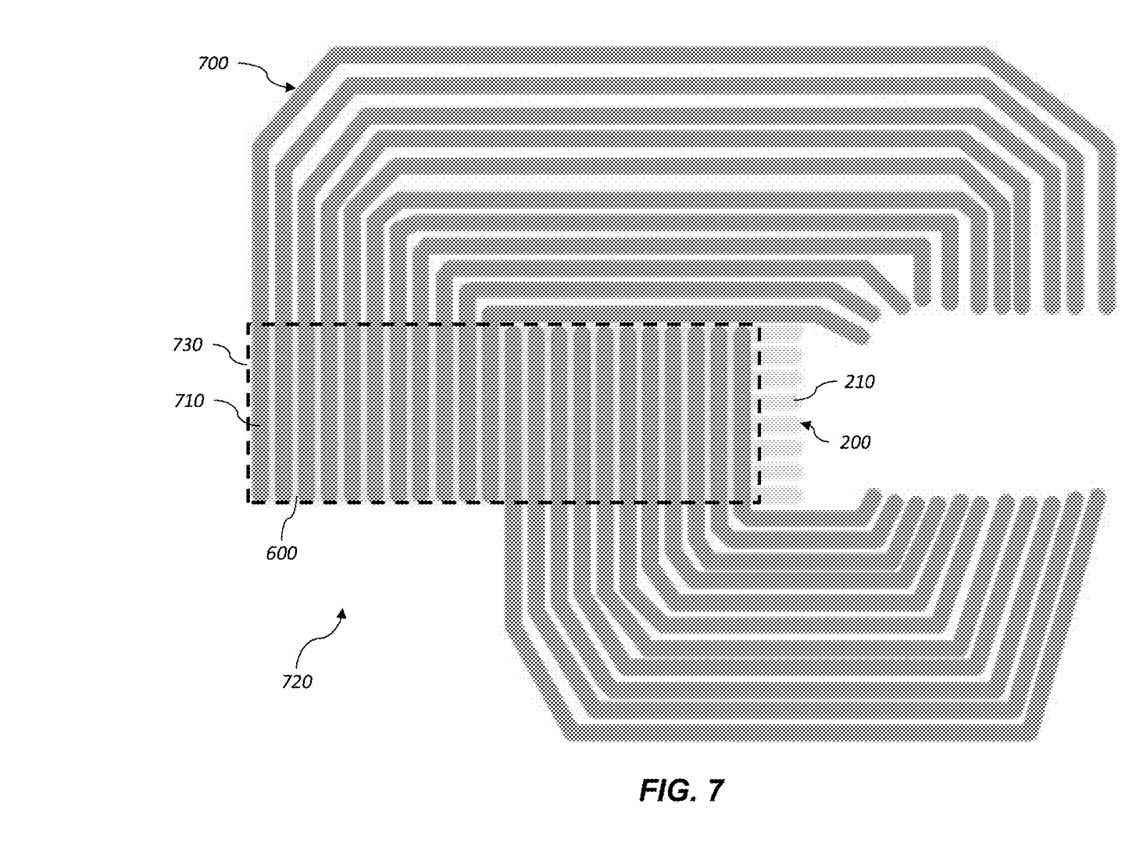
FIG. 7 illustrates printed conductive traces formed over the dielectric layer to provide an electronic layout.

FIG. 7 shows a conductive trace layer 700 including a pattern of conductive traces 710, which in an exemplary embodiment is formed using a printing process. Any appropriate printing process known in the art can be used to apply the conductive trace layer 700 using a printing plate to apply a conductive ink in a pattern corresponding to the pattern of conductive traces 710. For example, a flexographic printing process or a rotary screen printing process can be used. The conductive trace layer 700 is formed over the dielectric layer 600 in accurate registration with the patterned conductive layer 200, thereby forming an electronic layout 720. Examples of conductive inks that can be used in accordance with the present invention would include inks having metallic nanoparticles. In an exemplary embodiment, the conductive ink is an ink that includes silver nanoparticles, such as the ink described in U.S. Pat. No. 9,085,699 (Wang et al.), entitled "Silver metal nanoparticle composition." In other embodiments, the conductive ink can include copper nanoparticles, or other types of conductive materials.

In an alternate embodiment, the conductive trace layer 700 can be formed by laser ablation rather than by a printing process. For example, a piece of HCF material can be patterned using a laser ablation process as was described relative to FIG. 3 to provide the pattern of conductive traces 710. The resulting patterned HCF material can then be affixed over the dielectric layer 600 in accurate registration with the patterned conductive layer 200. Alternately, a uniform conductive layer can be applied over the dielectric layer and the laser ablation process can be used to form the pattern of conductive traces 710 in place. In this case, the laser ablation process needs to be controlled so that only the conductive material in the conductive trace layer 700 is removed.

The pattern of conductive traces 710 overlap with the conductive lines 210 of the patterned conductive layer 200 to form an electric grid in a display area 730. In the illustrated embodiment, the conductive traces 710 are formed so that they are substantially perpendicular relative to the conductive lines 210 of the patterned conductive layer 200 in the display area 730 where the conductive traces 710 cross the conductive lines 210. Within the context of the present invention "substantially perpendicular" should be interpreted to mean 90°±10°.

Figure 8:
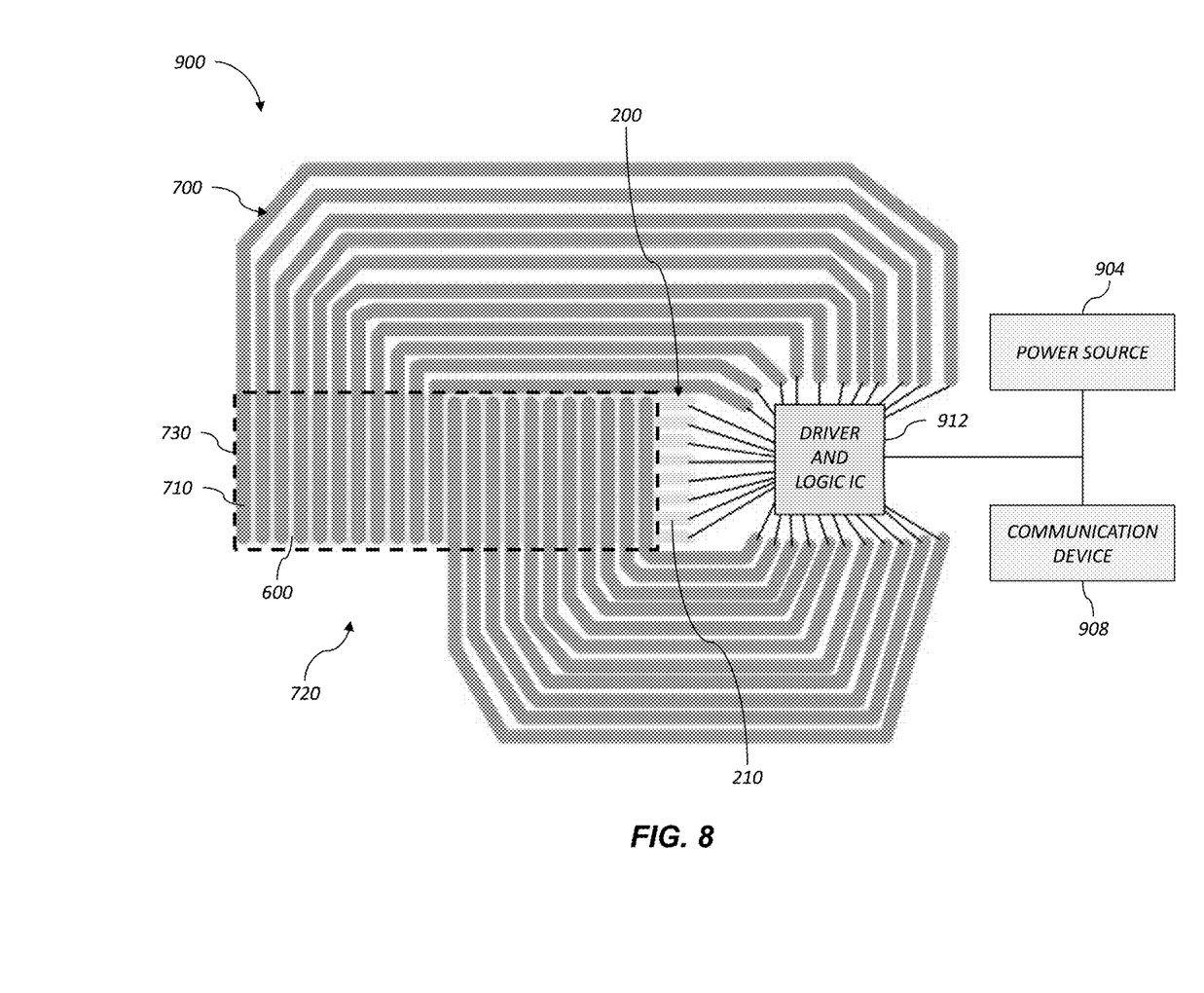
FIG. 8 illustrates a printed electronic label including driver and communication components added to the electronic layout of FIG. 7.

FIG. 8 shows a printed label 900. The patterned conductive layer 200, the phosphorescent layer 500 (not visible in FIG. 8), the dielectric layer 600 and the conductive trace layer 700 combine to form electrical layout 720. The printed label 900 also includes a power source 904. The power source 904 can be an separate component that is attached by conventional bonding methods, or alternatively can be printed battery added to the conductive trace layer 700. An example of using printing techniques for printing batteries is described in the U.S. Pat. No. 8,318,358 (Nelson et al.), entitled "Lithium inks and electrodes and batteries made therefrom." A driver and logic integrated circuit 912 is also added to conductive trace layer 700, as well as a communication device 908. These components can be applied using conventional chip bonding methods that are well-known in the art.

The driver and logic integrated circuit 912 performs the functions of an electronic display driver and a logic circuit. The driver and logic integrated circuit 912 is connected to the conductive lines 210 of the patterned conductive layer 200 and the conductive traces 710 of the conductive trace layer 700, and is adapted to supply appropriate control signals to provide a voltage across the phosphorescent layer 500, causing it to glow in selective locations. Integrated circuitry that can be used for the driver and logic integrated circuit 912 is well-known in the digital display art, and any appropriate device that perform the required functions can be used in accordance with the present invention.

The communication device 908 enables an external device, such as a hand held electronic device, to communicate with the driver and logic integrated circuit 912. In an exemplary embodiment, the communication device 908 is an RFID device. Other examples of communication devices 908 include NFC devices and light Bluetooth devices.

Figure 9:
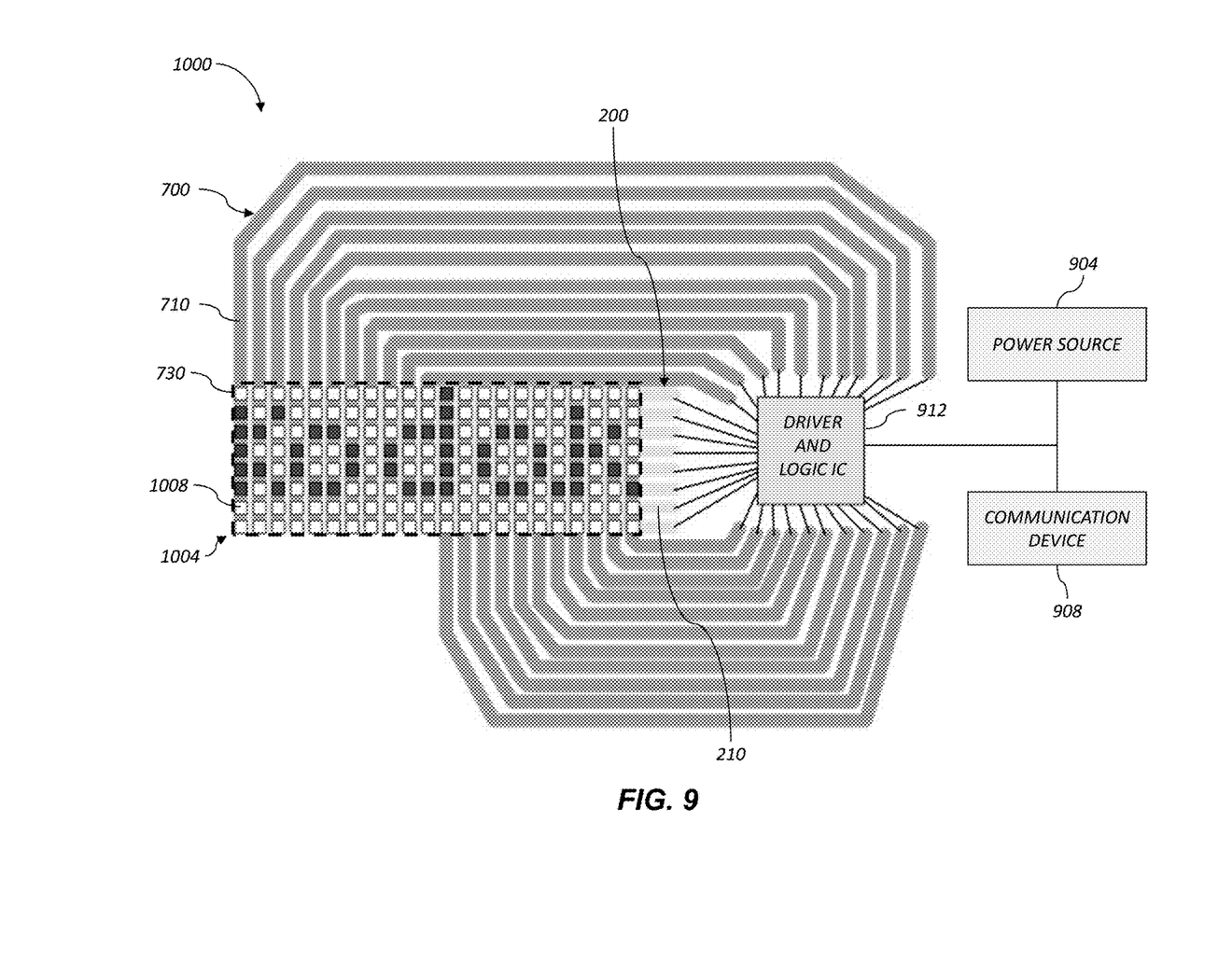
FIG. 9 illustrates a printed electronic label including a display unit with a matrix of display pixels.

FIG. 9 shows a fully assembled electronic label 1000, which includes a display unit 1004 having a matrix of activatable display pixels 1008 formed in the display area 730. Each display pixel 1008 corresponds to the intersection between a conductive line 210 in the patterned conductive layer 200 and a conductive trace 710 in the conductive trace layer 700. The display unit 1004 in the illustrated figure includes an 8×22 matrix of display pixels 1008 for clarity purposes. However, it will be understood that this approach can be used to produce electronic labels 1000 having much larger numbers of pixels, to provide high resolution displays with small feature sizes.

The printed electronic label 1000 is controlled by the driver and logic integrated circuit 912. The driver and logic integrated circuit 912 is capable of communicating with external devices such as hand held electronic devices or network computers via the communication device 908. For example, the external device can supply the content to be displayed on the electronic label 1000. The driver and logic integrated circuit 912 controls the content displayed on the display unit 1004 by controlling the voltage differences between the conductive lines 210 of the patterned conductive layer 200 and the conductive traces 710 of the conductive trace layer 700. In a preferred embodiment, each line of the display unit 1004 is activated in a time sequence by supplying appropriate voltages to the corresponding conductive line 210 and the intersecting conductive traces 710. When there is a voltage difference between a conductive line 210 and an intersection conductive trace 710, the phosphor material in the phosphorescent layer 500 (FIG. 5) will glow in the intersecting pixel region of the corresponding display pixel 1008 producing a light pixel. When no voltage difference is present, the display pixel 1008 will be a dark pixel. In this way, the image content displayed by the display unit 1004 is built up one line at a time.

In some embodiments, an adhesive material is added to the back of the electronic label 1000 to enable it to be conveniently affixed to a surface, such as a package. For example, the adhesive can be a glue or a peel and stick adhesive.

Figure 10:
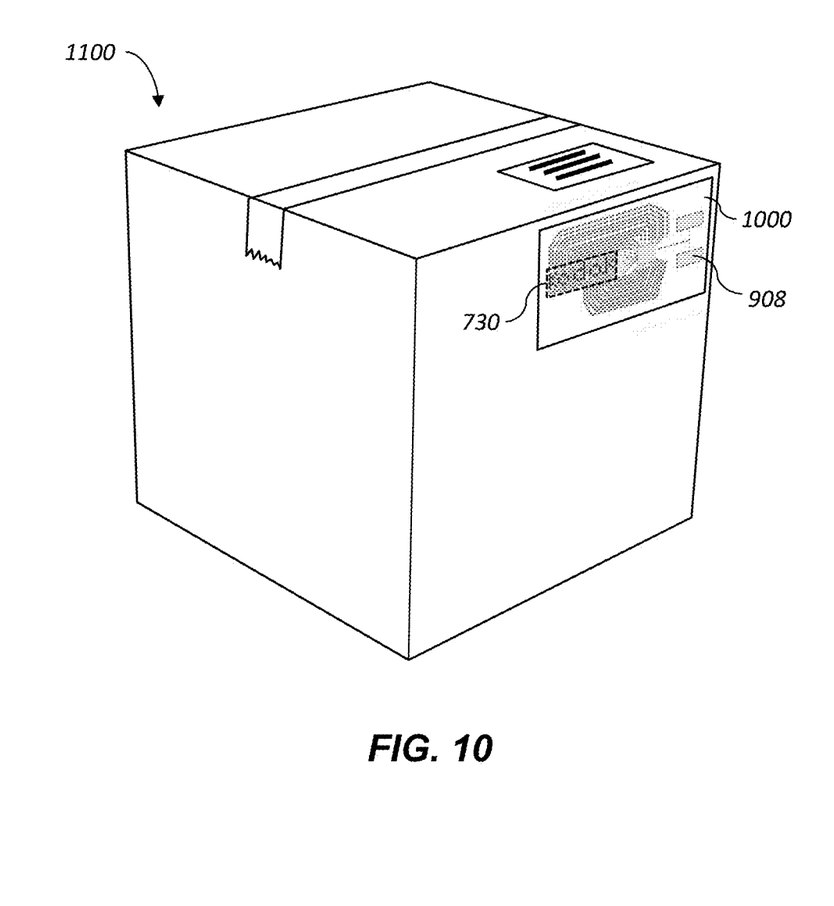
FIG. 10 illustrates a package with printed electronic label.

FIG. 10 shows a generic package 1100, such which are used for merchandise packaging. A printed electronic label 1000 is attached with an adhesive means to the package 1100. The content displayed in the display area 730 of the printed electronic label 1000 can be controlled by sending appropriate control signals from an external device which are received by the communication device 908. For example, the content can be controlled to display the contents of the package 1100, or the location where the package 1100 is to be delivered.

The invention has been described in detail with particular reference to certain preferred embodiments thereof, but it will be understood that variations and modifications can be effected within the spirit and scope of the invention.

PARTS LIST 100 conductive film
200 patterned conductive layer
210 conductive lines
220 reduced conductivity areas
304 digital front end (DFE)
308 imaging device
312 interface line
400 imaging system
404 rotating cylinder
416 screw
420 imaging head
428 controller
432 imaging carriage
500 phosphorescent layer
600 dielectric layer
700 conductive trace layer
710 conductive traces
720 electronic layout
730 display area
900 printed label
904 power source
908 communication device
912 driver and logic integrated circuit
1000 electronic label
1004 display unit
1008 display pixels
1100 package

The invention claimed is:

1. A method for forming an electronic label comprising:
providing a conductive film including a conductive layer on a substrate;
using laser imaging to form a pattern of conductive lines on the conductive film, thereby forming a patterned conductive layer, wherein the laser imaging includes removing conductive material from the conductive film by laser ablation, wherein the conductive lines are formed on areas of the conductive film where laser ablation was not applied;
adding a phosphorescent layer over the patterned conductive layer;
adding a dielectric layer over of the phosphorescent layer;
printing a conductive trace layer over the dielectric layer using a conductive ink, wherein the conductive trace layer includes a pattern of conductive traces that overlap with the conductive lines of the patterned conductive layer to form an electric grid in a display area;
adding one or more electronic components adapted to supply control signals to the electric grid; and
adding a power source adapted to supply power to the electronic components and the electric grid.

2. The method of claim 1, wherein the conductive film includes a conductive layer including Poly 3,4-ethylenedioxythiphene on a polyethylene terephthalate substrate.

3. The method of claim 1, wherein the phosphorescent layer includes a phosphorescent material.

4. The method of claim 3, wherein the phosphorescent material is based on zinc sulfide.

5. The method of claim 1, wherein the phosphorescent layer is added using a printing process.

6. The method of claim 1, wherein the layer includes a dielectric material.

7. The method of claim 6, wherein the dielectric material is titanate.

8. The method of claim 1, wherein the dielectric layer is added using a printing process.

9. The method of claim 1, wherein the conductive traces of the conductive trace layer are substantially perpendicular to the conductive lines of the patterned conductive layer in the display area.

10. The method of claim 1, wherein the electronic components include an electronic driver, a logic circuit or a communication device.

11. The method of claim 1, wherein the electronic components are attached to the electronic label.

12. The method of claim 1, wherein the power source is a battery that is printed on the electronic label.

13. The method of claim 1, wherein the power source is attached to the electronic label.

14. The method of claim 1, wherein the laser imaging process used to form the pattern of conductive lines on the conductive film uses a laser ablation process to remove portions of the conductive layer leaving the pattern of conductive tines.

* * * * *